United States Patent
Fu et al.

(10) Patent No.: US 6,278,748 B1
(45) Date of Patent: Aug. 21, 2001

(54) RATE 5/6 MAXIMUM TRANSITION RUN CODE FOR READ CHANNELS

(75) Inventors: Leo Fu, Sunnyvale; An-Loong Kok, Irvine, both of CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/070,438

(22) Filed: Apr. 30, 1998

(51) Int. Cl.[7] .................... H03D 1/00; H04L 27/06; H04L 5/12; H04L 23/02; H03M 7/00
(52) U.S. Cl. .................. 375/341; 375/263; 375/262; 341/59; 341/61
(58) Field of Search ..................... 375/263, 341, 375/340, 290, 262, 265; 360/39, 40, 48; 714/759, 746, 794, 795, 792; 341/59, 50, 61, 58, 68, 94, 106

(56) References Cited

U.S. PATENT DOCUMENTS

| | | | |
|---|---|---|---|
| 5,731,768 | * | 3/1998 | Tsang ........................... 341/59 |
| 5,754,593 | * | 5/1998 | Koren ........................... 375/263 |
| 5,949,357 | * | 9/1999 | Fitzpatrick et al. ........... 341/68 |

* cited by examiner

*Primary Examiner*—Stephen Chin
*Assistant Examiner*—Betsy L. Deppe
(74) *Attorney, Agent, or Firm*—W. Daniel Swayze, Jr.; Wade James Brady, III; Frederick J. Telecky, Jr.

(57) ABSTRACT

A method and apparatus encoding and decoding data for storage on a mass storage device is described. The code used is a 5/6 rate code in which a maximum transition run constraint is imposed. This code is designed for use with an EEPR4 read channel and provides a Euclidian squared free distance, $d^2$free, of 10 when used with an EEPR4 partial response filter and a Viterbi decoder.

3 Claims, 5 Drawing Sheets

$$A_{k+1} = x^4_{k+1} \cdot x^5_{k+1} + x^1_{k+1} \cdot x^2_{k+1} \cdot x^3_{k+1} + x^2_{k+1} \cdot x^3_{k+1} \cdot x^4_{k+1}$$

$$B_{k+1} = x^1_{k+1} \cdot x^2_{k+1} \cdot x^3_{k+1} \cdot x^4_{k+1}$$

$$Z4 = \overline{(x^1_k + x^2_k + x^3_k + x^4_k)}$$

$$Z5 = Z4 \cdot \overline{x^5_k}$$

$$C = A_k \cdot \overline{B_k}$$

$$D = Z5 \cdot \overline{A_{k+1}}$$

$$E = Z4 \cdot D \cdot \overline{u_k}$$

$$g^1_k = C + B_k + E$$

$$g^2_k = \overline{A_k} \cdot x^1_k + B_k + E$$

$$g^3_k = \overline{A_k} \cdot x^2_k + C \cdot x^1_k$$

$$g^4_k = \overline{A_k} \cdot x^3_k + C \cdot [\overline{x^2_k} \cdot x^3_k + \overline{x^1_k} \cdot x^2_k (x^3_k \oplus x^4_k) + x^1_k \cdot x^2_k \cdot x^4_k] + \overline{B_k}(S_k + S_k \cdot x^5_k)$$

$$g^5_k = \overline{A_k} \cdot x^4_k + C \cdot x^2_k (x^4_k \oplus x^5_k) + B_k \cdot S_k + D$$

$$S_{k+1} = \overline{A_k} \cdot x^5_k + C \cdot \overline{x^2_k} + B_k \cdot \overline{S_k} \cdot x^5_k$$

$$g^6_k = \overline{B_{k+1}} \cdot S_{k+1} + D$$

$$u_{k+1} = g^6_k$$

$$P3 = \overline{(g^4_{k-1} + g^5_{k-1} + g^6_{k-1})}$$

$$P4 = \overline{g^3_{k-1}} \cdot P3$$

$$P5 = \overline{g^2_{k-1}} \cdot P4$$

$$P6 = \overline{g^1_{k-1}} \cdot P5$$

$$Q2 = \overline{(g^1_k + g^2_k)}$$

$$Q3 = \overline{g^3_k} \cdot Q2$$

$$Q4 = \overline{g^4_k} \cdot Q3$$

$$F = P3 \cdot Q4 + P4 \cdot Q3 + P5 \cdot Q2 + P6 \cdot \overline{g^1_k}$$

$a = \hat{y}^1_k \cdot \hat{y}^2_k \cdot \overline{\hat{y}^3_k} \cdot \overline{\hat{y}^4_k}$ $b = \hat{y}^5_k \cdot \hat{y}^6_k$ $c = b \oplus \hat{y}^5_k$ $d = b \oplus \hat{y}^6_k$ $e = a \cdot \bar{c}$ $f = e \oplus \hat{y}^1_k$ $g = e \oplus \hat{y}^2_k$ $p = f \cdot g$ $z^1_k = f$ $z^2_k = g$ $z^3_k = \hat{y}^3_k$ $z^4_k = \hat{y}^4_k$ $z^5_k = c$ $z^6_k = d$ $u1 = z^1_{k-1}$ $u2 = z^2_{k-1}$ $u3 = z^3_{k-1}$ $u4 = z^4_{k-1}$ $u5 = z^5_{k-1}$ $u6 = c \cdot p + z^6_{k-1} \cdot \bar{p}$ $h0 = \overline{u2} \cdot \overline{u3} \cdot u6$ $h1 = \overline{u2} \cdot \overline{u3} \cdot \overline{u6}$ $h2 = \overline{u2} \cdot u3 \cdot u6$ $h3 = \overline{u2} \cdot u3 \cdot \overline{u6}$ $h4 = \overline{u1} \cdot u2$ $k = u4 \oplus u5 \oplus u6$ $\hat{x}^1_{k-1} = \overline{u1} \cdot u2 + u1 \cdot (h2 + h3 + h4)$ $\hat{x}^2_{k-1} = \overline{u1} \cdot u3 + u1 \cdot (h1 + h3 + h4)$ $\hat{x}^3_{k-1} = \overline{u1} \cdot u4 + u1 \cdot (\overline{u2} \cdot u4 \cdot u6 + \overline{u2} \cdot \overline{u4} \cdot \overline{u6} + u2)$ $\hat{x}^4_{k-1} = \overline{u1} \cdot u5 + u1 \cdot (h0 + h1 + h2 + h3 \cdot u4 \cdot + h4)$ $\hat{x}^5_{k-1} = \overline{u1} \cdot u6 + u1 \cdot (h0 + h1 \cdot \overline{u5} + h2 + h3 \cdot (u4 \cdot + u5) + (h4 \cdot \bar{k}))$

FIG. 5

RATE 5/6 MAXIMUM TRANSITION RUN CODE FOR READ CHANNELS

FIELD OF THE INVENTION

The present invention relates generally to the field of coding data; particularly, the present invention relates to encoding of data for use with a partial response maximum-likelihood read channel.

BACKGROUND OF THE INVENTION

This invention relates to coding techniques for use with magnetic storage media. Designs for magnetic storage media systems must simultaneously maximize the density of information stored on the media and ensure that the storage system has adequate error tolerance. These two goals are always in tension. The features of a read channel that maximize the permissible storage density on the storage media also tend to reduce the error tolerance of the storage device and read channel.

Storage density can be maximized with the use of a partial response maximum likelihood (PRML) read channel. A PRML read channel always includes a partial response filter and a maximum likelihood decoder. The partial response filter provides an output signal that represents a mathematical combination of the stored bits from a moving window of adjacent bits in the sequence of stored bits on the magnetic media. The output of the filter is then fed to a decoder that determines the sequence of bits most likely to have produced the filter output. Use of a partial response filter in the read channel permits higher density storage of data on the magnetic media. See H. Kobayashi, D. T. Tang, "Application of Partial-response Channel Coding to Magnetic Recording Systems", *IBM Journal of Research & Development*, July 1970, pp. 368–375.

The decoder in a PRML read channel uses a maximum-likelihood sequence detection algorithm such as the Viterbi algorithm. The decoder converts the output of the partial response filter into a sequence of binary values representing the sequence of bits stored onto the magnetic media. Methods for decoding PRML read channels using trellis decoders are shown, for example, in Jack W. Wolf & Gottfried Ungerboeck, "Trellis Coding for Partial Response Channels," *IEEE Transactions on Communications*, vol. COM-34, Aug. 1986, pp. 765–773, and G. David Forney, "The Viterbi Algorithm," *Proceedings of the IEEE*, March 1973, pp. 268–278, which are herein incorporated by reference.

Write and read channels for magnetic storage devices often employ encoding of the sequence of bits that is to be stored on the magnetic device. Encoding of the symbols to be recorded onto the magnetic storage media can be used to increase the noise tolerance of the entire system. The most common measure of noise signal tolerance of a trellis decoder is the minimum free squared Euclidean distance of the set of permissible paths through the trellis, $d^2_{free}$. The minimum free squared Euclidean distance measures the minimum difference in the path distance of any two paths in the trellis that start and end at the same node. One method of increasing the minimum free squared Euclidean distance of a read channel is to encode the sequence of symbols that are to be recorded onto the magnetic storage media. Encoding limits the set of permissible trellis paths and can be used to disallow alternative trellis paths that produce the worst case minimum free squared Euclidean distance measure. By disallowing these paths, the minimum free squared Euclidean distance of the remaining paths is improved.

Encoding, however, comes at a cost in that it expands the number of bits required to store a fixed amount of user source data on the disk. The rate of a code indicates the relationship between the number of bits of user data encoded and the number of bits of encoded data stored on the storage media. In a rate 5/6 code, five bits of user data are encoded into six bits of encoded data that are stored. It is always possible to increase the minimum free squared Euclidean distance of any encoding scheme by increasing the coding overhead and decreasing the rate of the code. Increasing the rate of the code used necessitates a decrease in the storage density that may be used.

One type of code that can be used for encoding is the class of Maximum Transition Run (MTR) codes. MTR codes have the property that the number of consecutive '1' symbols is limited to some maximum transition run length. In the non return to zero inverse (NRZI) convention often used in analysis of magnetic storage systems, a '1' symbol indicates the existence of a transition in the magnetic state stored, and a '0' symbol indicates that the current state is maintained. The MTR code used in the subject invention limits the maximum sequence of consecutive '1' symbols to two. Limiting the number of consecutive '1' symbols to two is equivalent to limiting the number of consecutive state transitions to two or less. Patterns of three or more consecutive transitions cause most of the errors in read channel detection systems, so using codes that eliminate these patterns produces significant error reduction dividends. See Jaekyun Moon & Barrett Brickner, "Maximum Transition Run Codes for Data Storage Systems," *IEEE Transactions oil Magnetics*, vol. 32, September 1996, pp. 3992–3994.

The central problem, therefore, for any designer of encoding and decoding channels for a storage device is to develop a coding procedure which maximizes the density of user data that may be stored on the magnetic media. This involves a trade-off between the coding rate used and the density of storage that may be achieved using any particular code. The designer's goal is to develop a code which maximizes the coding rate and provides a minimum free squared Euclidean distance that ensures the error detection margin required to support a particular storage density.

SUMMARY OF THE INVENTION

The present invention describes an apparatus and a method for encoding and decoding data. The inventive encoding system can be used with a storage medium that employs a partial response filter with the transfer function $h(D)=(1-D)(1+D)^3$, where D represents the delay operator. This is known as an extended-extended partial response channel of Class 4 (EEPR4).

The subject encoding system and read channel employ a rate 5/6 code. The code is an MTR code with the property that codewords are selected so that runs of consecutive '1' symbols are limited to two or less '1' symbols, and runs of consecutive '0' symbols are limited to runs of six or less of such '0' symbols. For this reason the code can be identified as a rate 5/6 MTR(2,6) code.

The code employed in the inventive encoding system and read channel has a minimum free squared Euclidean distance of 10, when used with an EEPR4 read channel. This value is large enough to provide an adequate margin of error for use in a magnetic disk drive system. Use of this code makes it possible to use an EEPR4 filter in the read channel, which would not be possible if a coding scheme with a lesser minimum free squared Euclidean distance was used.

An advantage of the present invention is that it provides a high density, rate 5/6 code that affords a minimum free squared Euclidean distance of 10 when used in an EEPR4 system.

Another advantage of the present invention is that it permits the use of an EEPR4 read channel, which makes possible higher read densities than would be afforded with lower-order partial response filters.

The foregoing, and other features and advantages of the invention, will be apparent from the following, more particular, description of the preferred embodiments of the invention, the accompanying drawings and the appended claims.

BRIEF DESCRIPTION OF THE DRAWINGS

FIG. 4 is a sequence of boolean equations that can be used to implement the encoding algorithm performed by the rate 5/6 MTR encoder of the present invention.

FIG. 5 is a sequence of boolean equations that can be used to implement the decoding algorithm performed by the rate 5/6 MTR decoder of the present invention.

DETAILED DESCRIPTION OF THE PREFERRED EMBODIMENT

The preferred embodiment of the present invention and its advantages are best understood by reference to FIGS. 1 through 6, where like reference numbers indicate like elements.

Figure 1:
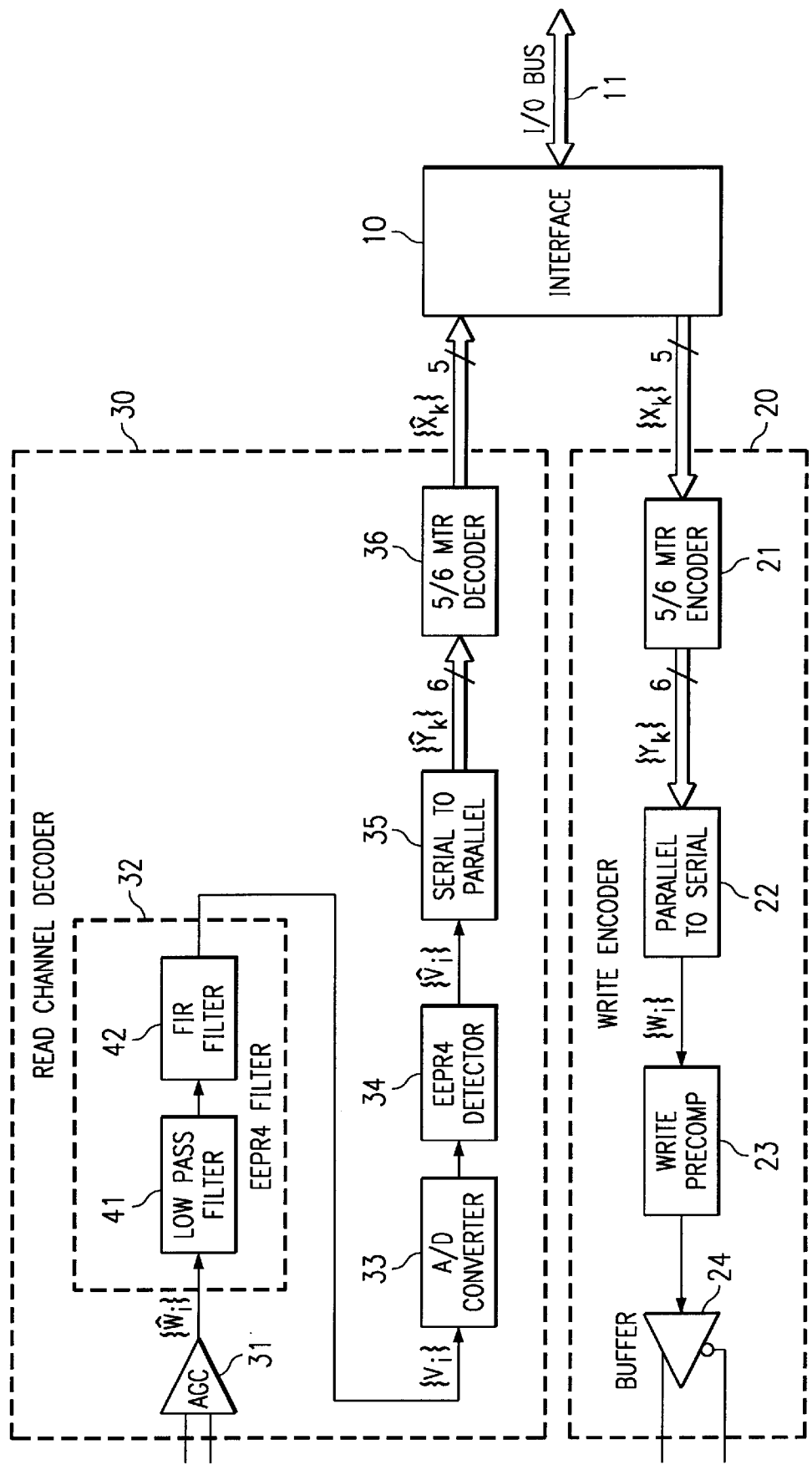
FIG. 1 is a block diagram illustrating the overall architecture of a write encoder and read channel decoder that can be used to implement the present invention.

FIG. 1 illustrates a functional block diagram of the write encoder 20 and read channel decoder 30 for a hard disk drive system. The bidirectional interface 10 interconnects the write encoding circuitry and read channel circuit with a drive controller (not shown) through I/O bus 11. Data to be written to the hard disk drive is conveyed over bidirectional interface 10 to write encoder 20 where it is encoded. The output of write encoder 20 from the output buffer 24 is a differential analog signal which can be used with external magnetic read/write circuitry to write the data to the hard disk media. When data is read from the hard disk, the differential analog signal read from the disk is received by automatic gain control clement 31 in read channel decoder 30. Read channel decoder 30 filters and decodes the signal to recover the data stored on the disk. The decoding performed by read channel decoder 30 reverses the encoding performed by write encoder 20 when the data was written to the disk. The decoded data is then transferred across I/O bus 11 to the drive controller.

The detailed operation of write encoder 20 will now be described. The external drive controller passes data that is to be written to write encoder 20 over I/O bus 11. A rate 5/6 MTR encoder 21 is coupled to the bidirectional interface. Data that is to be written to the disk drive is received at bidirectional interface 10 in an unencoded fonn, and is passed through bidirectional interface 10 to rate 5/6 MTR encoder 21. Rate 5/6 MTR encoder 21 converts this raw data into an encoded format, in accordance with the code described in detail below. This code encodes five bits of raw data received from the drive controller into six bits of encoded data that will be stored on the disk drive. While this has the effect of expanding the number of bits that must be stored on the disk drive, the use of the code permits denser storage of the drive media, more than offsetting the 20% overhead that results from the use of the 5/6 code. The output from the encoder can be thought of as a sequence of six-bit codewords $\{y_k\}(=\{y_0, y_1, \ldots y_k, \ldots \})$, where each $y_k$ represents a separate six-bit codeword.

Rate 5/6 MTR encoder 21 receives a sequence of symbols from interface circuitry 10. Each received symbol is five-bits wide. Encoder 21 converts each five-bit symbol received into an encoded output symbol that is made up of six-bits. In the discussion that follows, and in accordance with standard practice, data words are identified as a sequence of '0' and '1' characters, with the most significant bit (MSB) on the left and the least significant bit (LSB) on the right. The "first" bit in the codeword is synonymous with the MSB and the "last" bit in the codeword is synonymous with the LSB. In practice, it is purely a matter of definition as to whether the LSB or MSB is transmitted first when a word is transmitted serially, and the disclosed system can be implemented either way.

Source and codewords are processed sequentially in time by write encoder 20. This processing is pipelined so that processing of multiple codewords is proceeding simultaneously at different points in write encoder 20. When code or source words are described as the "current" or "preceding" or "previous" words, this indicates the nature of the sequential relationship between the two words. The "current" word follows directly after the "previous" or "preceding" word in the sequence of code or source words that is processed by the encoder/read channel.

The encoding algorithm used by rate 5/6 MTR encoder 21 has four steps. These steps must be performed in the order indicated. The operations performed in some of these steps are determined not only by the contents of the current source word but also by the encoded output codeword produced when the previous source word was encoded.

Step 1:

The first step of the conversion can be done as a table lookup. The five bits of the received symbol are used as an index into one of two translation tables. Each translation table includes 32 entries, so that each received sequence corresponds to a specific index in the table. Each entry in the table is occupied by a six-bit translation that will serve to represent the five-bit received symbol. The encoder determines which table to use based upon whether the previous encoded codeword had a '0' or a '1' in its last bit position. If the previous codeword had a '0' in its last bit position, then the "State-0" table should be used, otherwise the "State-1" table is used.

TABLE 1

"STATE-0" Conversion Table

| Input | Output |
|---|---|
| 00000 | 000000 |
| 00001 | 000001 |
| 00010 | 000010 |
| 00011 | 000001 |
| 00100 | 000100 |
| 00101 | 000101 |
| 00110 | 000110 |
| 00111 | 100101 |
| 01000 | 001000 |
| 01001 | 001001 |

TABLE 1-continued

"STATE-0" Conversion Table

| Input | Output |
|---|---|
| 01010 | 001010 |
| 01011 | 100100 |
| 01100 | 001100 |
| 01101 | 001101 |
| 01110 | 100010 |
| 01111 | 100000 |
| 10000 | 010000 |
| 10001 | 010001 |
| 10010 | 010010 |
| 10011 | 101001 |
| 10100 | 010100 |
| 10101 | 010101 |
| 10110 | 010110 |
| 10111 | 101101 |
| 11000 | 011000 |
| 11001 | 011001 |
| 11010 | 011010 |
| 11011 | 101100 |
| 11100 | 101000 |
| 11101 | 101010 |
| 11110 | 110100 |
| 11111 | 110101 |

TABLE 2

"STATE-1" Conversion Table

| Input | Output |
|---|---|
| 00000 | 000000 |
| 00001 | 000001 |
| 00010 | 000010 |
| 00011 | 000001 |
| 00100 | 000100 |
| 00101 | 000101 |
| 00110 | 000110 |
| 00111 | 100101 |
| 01000 | 001000 |
| 01001 | 001001 |
| 01010 | 001010 |
| 01011 | 100100 |
| 01100 | 001100 |
| 01101 | 001101 |
| 01110 | 100010 |
| 01111 | 100000 |
| 10000 | 010000 |
| 10001 | 010001 |
| 10010 | 010010 |
| 10011 | 101001 |
| 10100 | 010100 |
| 10101 | 010101 |
| 10110 | 010110 |
| 10111 | 101101 |
| 11000 | 011000 |
| 11001 | 011001 |
| 11010 | 011010 |
| 11011 | 101100 |
| 11100 | 101000 |
| 11101 | 101010 |
| 11110 | 110010 |
| 11111 | 110110 |

It will be observed that the "State-0" and "State-1" conversion tables differ only in the last two entries.

When the "States-1" table is used, the encoder must under undertake one additional step that does not apply when the "State-0" table is used. If the received source word sequence to be translated using the "State-1" table is either '11110' or '11111', the last bit of the previous codeword output of the encoder to use a different encoder must be inverted. The fact that the last bit has been inverted should not cause the encoder to use a different encoding table with the current source word. For example, if the previous encoded codeword is '110101', the encoder will use the "State-1" table with the current source word. If the current source word is '11111', the encoder must invert the last bit of the previous encoded codeword, making it '110100'. This does not, however, mean that the encoder should now use the "State-0" table to encode the current source word. Instead it will continue to use the "State-1" table, encoding '11111' as '110110'.

Step 2:

If the translated six-bit output produced from Step 1 is '000000' and the first bit of the following codeword is '0', then the last two bits of the current codeword must be changed to logical '1's so that the current codeword becomes '000011'. If this condition does not apply, the codeword passes through step two unchanged.

Step 3:

If the previous codeword has a '0' as its last bit, and the current six-bit output produced from step two has five zeroes in its first five bits, then the first two bits of the current codeword are modified to become logical ones. If this condition does not apply, the codeword passes through step three unchanged.

Step 4:

If the previous codeword ends with a sequence of zeroes and the current codeword starts with a sequence of zeroes, and the combined length of these sequences is seven bits or greater, then the last two bits of the previous codeword are modified to become logical ones. If this condition does not apply, the codeword passes through step four unchanged.

The encoding steps performed by rate 5/6 MTR encoder 21 can be performed by a sequence of boolean logic operations. The boolean equations shown in FIG. 4 implement the function of rate 5/6 MTR encoder 21. In these equations the five-bit symbol $x_k$ represents the symbol that is provided as an input to rate 5/6 MTR encoder 21. The binary variables $X^1_k, X^2_k, X^3_k, X^5_k$, represent the five bits of symbol $x_k$, with $X^1_k$ representing the first bit in the symbol and $X^5_k$ the last. The corresponding six-bit codeword produced as an output from rate 5/6 MTR encoder 21 is identified by the symbol $y_k$. The six bits that make up $y_k$ are identified as $y^1_k, y^2_k, y^3_k, y^4_k, y^5_k, y^6_k$. The input to rate 5/6 MTR encoder 21 is made up of a continuous sequence of five-bit symbols, $x_1, x_2, \ldots, x_{k-1}, x_k, x_{k+1}, \ldots$. The output from rate 5/6 MTR encoder 21 is likewise made up of a continuous sequence of six-bit codewords, $y_1, y_2, \ldots, y_{k-1}, y_k, y_{k+1}, \ldots$. The equations in FIG. 4 employ a number of intermediate variables, including a sequence of six-bit codewords $g_1, g_2, \ldots, g_{k-1}, g_k, g_{k+1}$, In the equations in FIG. 4, boolean logical OR operations are indicated as additions or with the '+' symbol, and logical AND operations are indicated as multiplication of two binary symbols or with the '.' symbol.

Turning again to FIG. 1, a parallel to serial converter 22 is coupled to the six-bit wide parallel output of rate 5/6 MTR encoder 21. Parallel to serial converter 22 serializes the six-bit wide output of rate 5/6 MTR encoder 21, which allows the encoded data to be written to the disk drive in a serial format. The serial output of parallel to serial converter 22, which can be represented as serial binary sequence $\{w_i\}$, is coupled to a write precompensation circuit (23).

The purpose of the precompensation circuit is to incrementally delay or advance the time at which signal pulses appear in the stream of data values to be written to the magnetic media. The precompensation circuit must determine which pulses need to be shifted. It does this by sorting them into groups based upon the presence of adjacent pulses. The user of write encoder 20 determines how much each group of pulses should be shifted. The shifting parameters are fixed based upon the characteristics of a particular magentic storage drive and can be adjusted separately for each drive device manufactured.

The output of precompensation circuit 23 is connected to output buffer 24 which is used to drive an encoded output signal that can be used with a standard hard disk drive write circuit or other storage media circuitry to store the encoded data onto magnetic media.

A detailed description of the operation of read channel decoder 30 will now be given.

Read channel decoder 30 receives data from an external disk drive read circuit (not shown). The disk drive read circuit produces a differential analog signal which is provided as an input to automatic gain control (AGC) circuit 31. The AGC circuit is a standard feature of disk drive circuitry that amplifies the differential signal received from the external read/write circuitry. The gain on this amplifier is adjusted to maintain constant signal amplitude at the input to an EEPR4 filter 32.

EEPR4 filter 32 is an analog circuit. The input signal provided to EEPR4 Filter 32 by AGC 31 and the output signal from filter 32 are continuous-time analog waveforms. The analog input signal to EEPR4 filter 32 represents a sequence $\{\hat{w}_i\}$ of binary values read from the storage media. Similarly, the output from filter 32 represents a sequence $\{v_i\}$ of discrete multilevel output values.

EEPR4 filter 32 is best described in terms of with reference to a discrete time model 200 of an EEPR4 filter. Discrete time model 200 operates on a sequence of discrete inputs, each of which is a binary sample of two possible values. From this input sequence, the discrete time model produces a sequence of discrete multi-level output values. In contrast, EEPR4 filter 32 is an analog circuit that operates on a continuous input signal and produces therefrom a continuous output signal. As noted above, however, the analog input and output signals to and from EEPR4 filter 32 represent discrete time sequences of binary or multi-level values. The relationship between the binary input sequences and the multi-level output sequences conveyed by these analog inputs and outputs is identical to the relationship between the discrete time input and output sequences of discrete time model 200.

Figure 2:
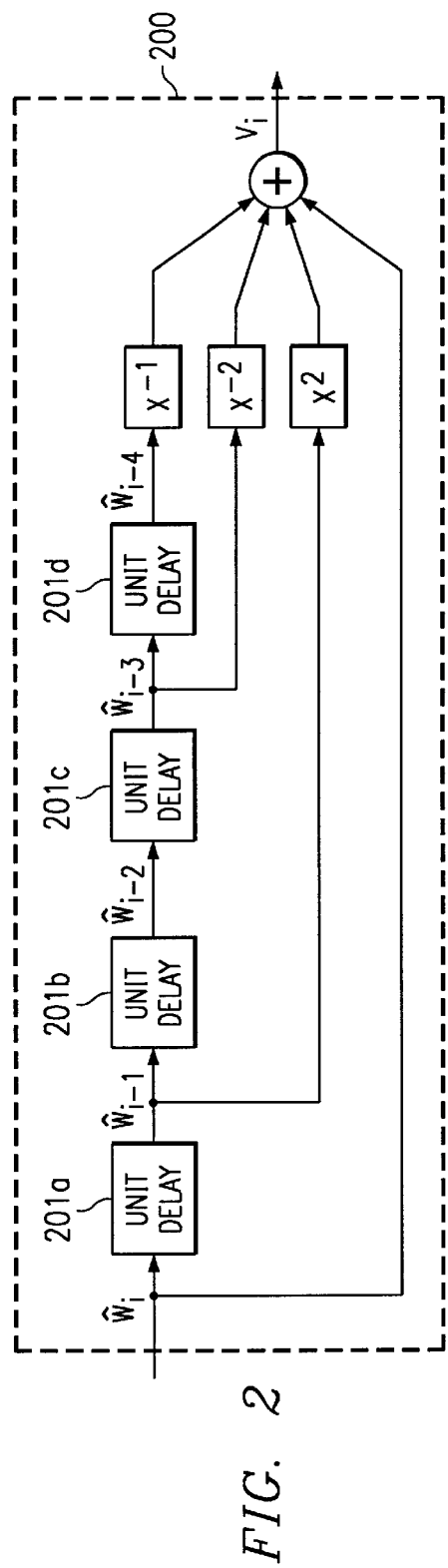
FIG. 2 is an idealized EEPR4 partial response filter in accordance with the present invention.

In FIG. 2, discrete time model 200 is illustrated. The schematic shown in FIG. 2 is a discrete time model of an extended extended partial response class 4 filter. It is not a schematic representation of the analog circuitry found in EEPR4 filter 32. Model EEPR4 filter 200 is a finite response filter. The filter receives a sequence of binary input values $\{\hat{w}_i\}$ selected from the set of $\{+1, -1\}$ and produces an output sequence $\{\hat{v}_i\}$ of multilevel symbols selected from the set $\{+6, +4, +2, 0, -2, -4, -6\}$. The model filter employs four unit delay blocks 201a–d that store previous elements of the input sequence so that five consecutive sequence members $\{\hat{w}_{i-4}, \hat{w}_{i-3}, \hat{w}_{i-2}, \hat{w}_{i-1}, \hat{w}_i\}$ are available to the filter simultaneously. The sequence members are scaled and added in accordance with the EEPR4 filter equation h(D)= $(1-D)(1+D)^3$, where D represents the unit delay operator. Equivalently, the encoder output sequence, $\{v_i\}$, is related to the binary input sequence, $\{w_i\}$, by: $v_i = w_i + 2w_{i-1} - 2w_{i-3} - w_{i-4}$.

Turning again to FIG. 1, the manner in which filter circuitry 32 implements model EEPR4 filter 200 will now be described.

Filter circuitry 32 comprises a low-pass filter 41/and a finite impulse response (FIR) filter 42. Low-pass filter 41 is coupled to the output of AGC circuit 31. Low-pass filter 41 is a continuous time filter, the output of which is coupled to FIR filter 42. In the preferred embodiment of the invention, low-pass filter 41 has programmable cutoff, boost and group delay settings. Low-pass filter 41 performs two functions. First, it filters out noise signals that have frequencies outside the bandwidth of the signal read from the magnetic storage device. Second, low-pass filter 41 shapes the pulse stream read from the magnetic storage device. The result of this shaping, when combined with the effect of FIR filter 42, is to produce a partial response filtering effect, so that the output of low-pass filter 41 and FIR filter 42 represents the pulse sequence originally stored on the disk filtered through a class 4 partial response filter. The programmable settings for the cutoff, boost and group delay characteristics of low-pass filter 41 must be set in accordance with the particular properties of the magnetic storage media and the disk drive read circuitry of storage device used with read channel decoder 30.

FIR filter 42 is used for fine shaping of the sampled read signal to make it perform the function of model EEPR4 filter 200. The output of EEPR4 filter 32 is an analog continuous time waveform, which is fed as an input to analog to digital (A/D) converter 33. A/D converter 33 takes the analog output of EEPR4 filter 32 and converts it a sequence of discrete multilevel output samples $\{v_i\}$. The multilevel output from the filter circuitry, $\{v_i\}$, is coupled to the input of an EEPR4 detector (34). EEPR4 detector 34 is a maximum likelihood Viterbi detector. Each element in the sequence can take on one of the set of values $\{+6, +4, +2, 0, -2, -4, -6\}$. These values cannot be decoded directly into corresponding stored bit values. Rather, each symbol in the $\{v_i\}$ sequence corresponds to a one-bit transition through the state trellis for EEPR4 detector 34. The detector algorithm tracks all possible paths that might be used to traverse the state trellis and selects the path which best fits the sequence of transition symbols received by the decoder. Once the "best fit" path has been determined, the stored bit values that produced the "best fit" state transition path are identified and EEPR4 detector 34 provides, at its output, a sequence $\{\hat{v}_i\}$ of stored bit values.

Figure 3:
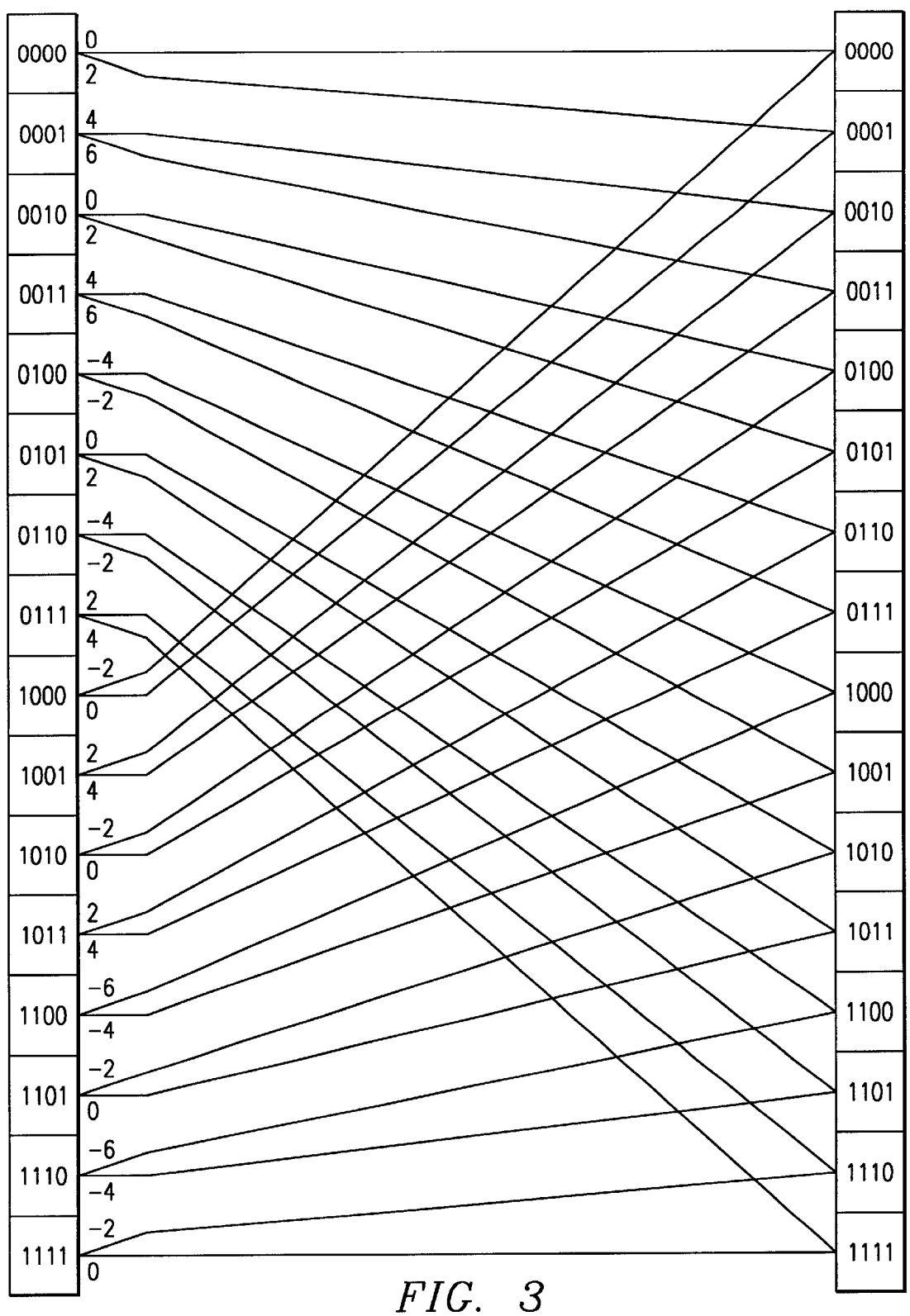
FIG. 3 is a decoding trellis for use by a Viterbi detector in detecting an EEPR4 filtered signal in accordance with the present invention.

The Viterbi detection algorithm used in EEPR4 detector 34 employs the state transition trellis given in FIG. 3. The nodes on the left and right hand sides of the trellis indicate the starting and ending states, respectively, of EEPR4 detector 34.

The trellis indicates which transitions are possible as EEPR4 detector 34 advances one bit at a time through a sequence of bits to be decoded. Every permissible transition is represented as a line in the trellis, and the values indicated near each permissible transition represent the expected output from the EEPR4 encoder during that transition. These expected transition values may be combined with the multilevel transition symbol actually received $(v_i)$ to create branch metrics for the Viterbi decoder. Using the branch metrics the most likely path can be determined.

EEPR4 detector 34 produces an output sequence $\{\hat{v}_i\}$ of serial bits. In order to decode this sequence of bits they must be reassembled into six-bit wide codewords. This reassembly is done by serial to parallel circuitry 35. To assemble the serial sequence of data into six-bit codewords, serial to parallel circuitry 35 must have an indication of which bits in the serial sequence $\{\hat{v}_i\}$ represent the first or last bit of a six-bit codeword. This information is provided to serial to parallel 35 by synchronization circuitry (not shown). The synchronization circuitry recovers the boundaries of the six-bit codewords by monitoring patterns in the data received.

Serial to parallel circuitry 35 produces an output sequence of six-bit words $\{\hat{y}_k\}$ which represents the best estimate of the serial sequence $\{y_k\}$ that was written to the disk. The rate 5/6 MTR code used in the inventive PRML read channel makes it impossible for certain sequences of bits to appear in the sequence $\{y_k\}$ produced by rate 5/6 MTR encoder 21. Therefore these disallowed sequences must also not appear in the output sequence $\{\hat{y}_k\}$ of EEPR4 detector 34. If a disallowed sequence is identified by EEPR4 detector 34 as the most likely sequence, the detector should not provide this sequence as its output. Instead, EEPR4 detector 34 should provide the most likely sequence that is not disallowed by the rate 5/6 MTR code used.

Rate 5/6 MTR decoder 36 takes each six-bit word output from serial to parallel circuitry 35 and reverses the encoding performed by rate 5/6 MTR encoder 21. The decoding operation performed by rate 5/6 MTR decoder 36 has four steps. These steps must be performed in the order indicated. In step three, the content of a first codeword received by decoder 36 may be altered as a consequence of the content of the next codeword received by decoder 36. Whether any changes will be made to a particular input codeword in step 3 cannot be determined until steps 1 through 2 have been conducted for the next codeword. This creates a dependancy in the processing of received codewords. Step three of the decoding process cannot proceed for one codeword until steps one and two have been performed on the following codeword.

Step 1:

If the last two bits of a codeword are both '1', then replace the last two bits of the codeword with the symbol sequence '00'.

Step 2:

If the first five bits of a codeword are '11000', then replace the first five bits of the codeword with the symbol sequence '00000'.

Step 3:

If the first three bits of the current codeword are '110' and the last two bits of the current codeword are '10', then invert the last bit of the previous codeword.

Step 4:

The modified codeword can now be translated using the decoding table. Examination of the table reveals that it contains only 32 entries, so that all possible comvinations of six-bit inputs do not have entries. This is a result of the fact that steps one through three of the decoding process prevent many possible combinations from occurring.

TABLE 3

Decoding Table

| Input | Output |
| --- | --- |
| 000000 | 00000 |
| 000001 | 00001 |
| 000010 | 00010 |
| 100001 | 00011 |
| 000100 | 00100 |
| 000101 | 00101 |
| 000110 | 00110 |
| 100101 | 00111 |
| 001000 | 01000 |
| 001001 | 01001 |

TABLE 3-continued

Decoding Table

| Input | Output |
| --- | --- |
| 001010 | 01010 |
| 100100 | 01011 |
| 001100 | 01100 |
| 001101 | 01101 |
| 100010 | 01110 |
| 100000 | 01111 |
| 010000 | 10000 |
| 010001 | 10001 |
| 010010 | 10010 |
| 101001 | 10011 |
| 010100 | 10100 |
| 010101 | 10101 |
| 010110 | 10110 |
| 101101 | 10111 |
| 011000 | 11000 |
| 011001 | 11001 |
| 011010 | 11010 |
| 101100 | 11011 |
| 101000 | 11100 |
| 101010 | 11101 |
| 110010 | 11110 |
| 110110 | 11111 |

The decoding steps performed by rate 5/6 MTR decoder 36 can be performed by a sequence of boolean logic operations. The boolean equations shown in FIG. 5 implement the function of rate 5/6 MTR decoder 36. In these equations the six-bit codeword provided as an input to rate 5/6 MTR decoder 36 is identified by the symbol $\hat{y}_k$. The six bits that make up $\hat{y}_k$ are identified as $\hat{y}^1_k, \hat{y}^2_k, \hat{y}^3_k, \hat{y}^4_k, \hat{y}^6_k$. The five bit symbol $\hat{x}_k$ represents the decoded symbol that is produced as an output from rate 5/6 MTR decoder 36. The binary variables ($\hat{x}^1_k, \hat{x}^2_k, \hat{x}^3_k, \hat{x}^4_k, \hat{x}^5_k$) represent the five bits of symbol $\hat{x}_k$, with $\hat{x}^1_k$ representing the first bit in the symbol and $\hat{x}_k$ the last. The input to rate 5/6 MTR decoder 36 is made up of a continuous sequence of six-bit codewords, $\hat{y}_1, \hat{y}_2, \ldots \hat{y}_{k-1}, \hat{y}_k, \hat{y}_{k+1}, \ldots$. The output from rate 5/6 MTR decoder 36 is likewise made up of a continuous sequence of five-bit symbols, $\hat{x}_1, \hat{x}_2, \ldots, \hat{x}_{k-1}, \hat{x}_k, \hat{x}_{k+1}, \ldots$. The equations in FIG. 5 employ a number of intermediate variables, including a sequence of six-bit codewords $\hat{z}_1, \hat{z}_2, \ldots, \hat{z}_{k-1}, \hat{z}_k, \hat{z}_{k+1}, \ldots$ The operation of the invented encoding and decoding system in the context of a hard disk drive system is best illustrated with reference to FIG. 6. Hard disk drive unit 50 is connected to a host computer 60 by way of SCSI bus 70. The SCSI interface is a standardized protocol for interconnecting peripheral devices to microcomputers. Inside hard disk drive unit 50, SCSI bus 70 is connected to drive controller 51. Drive controller 51 is designed to receive control messages and data from host computer 60 and to transfer data and status information back to host computer 60. Drive controller 51 is connected to encoder/decoder interface 10 and digital signal processor (DSP) 52. The connection between drive controller 51 and encoder/decoder interface 10 is bidirectional. Drive controller 51 can pass data that is to be written to the hard disk to encoder/decoder interface 10 and receive data that has been read from the hard disk from encoder/decoder interface 10. Information relating to the position on the disk where data is to be read or written is passed from drive controller 51 to DSP 52. DSP 52 is connected to and controls the movement of actuator 55. Actuator 55 controls the location of write head 56 and read head 57. DSP 52 is also connected to spin motor phase locked loop (PLL) 53. Both DSP 52 and spin motor PLL 53 are connected to spin motor 54, which controls the spinning of the magnetic disks.

Data to be stored onto the hard disk drive passes from drive controller 51 to the encoder/decoder interface 10. Encoder/decoder interface 10 then passes the data to write channel circuitry 20, where it is encoded. The output from write encoder 20 is provided to write head 56. Data is read from the hard disk by read head 57, and provided at the input to read channel circuitry 30, where the data is decoded. Decoded data is passed from the output of read channel circuitry 30 to encoder/decoder interface 10, where it is passed to drive controller 51.

Figure 6:
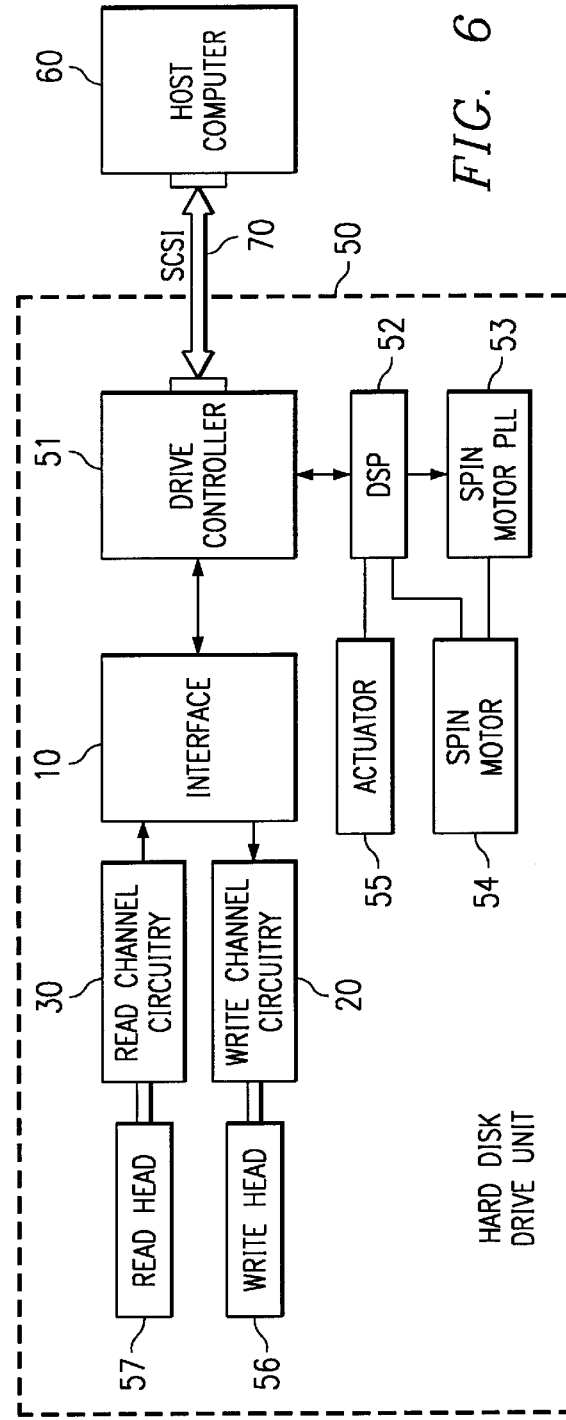
FIG. 6 is a block diagram illustrating the overall architecture of a disk drive storage device built utilizing the write encoder and read channel decoder of the present invention.

FIG. 6 indicates only one possible deployment of the invented encoding and decoding systems. Any number of variations on this design are possible. For instance, the connection between host computer 60 and drive controller 51 need not be implemented through a SCSI bus. An IDE/ATA bus is often used for this purpose instead of a SCSI bus. It is also possible to build a hard disk drive without an integrated drive controller or DSP. Other variations in the design are possible While the invention has been particularly shown and described with reference to the presently preferred embodiments thereof, it will be understood by those skilled in the art that various changes in form and details may be made therein without departing from the spirit and scope of the invention as defined in the appended claims.

While the encoding and decoding apparatus and methods described herein have been related in the context of an encoding and decoding channel for a magnetic storage device, the underlying encoding and decoding apparatus and methods could be used in connection with storage devices. The disclosed encoding and decoding apparatus and methods can be incorporated in storage devices using magnetic storage media, such as tape drives, or non-magnetic storage media, such as optical storage devices. In addition, the disclosed encoding and decoding apparatus and methods can be used to encode and decode data for transmission in communication channels and networking systems.

What is claimed is:

1. A read-channel decoding apparatus for decoding a sequence of encoded data comprising:

a partial response filter circuitry that filters a received input signal sequence in accordance with the transfer function $h(D)=(1-D)(1+D)^n$; and a decoder circuitry coupled to said partial response filter circuitry that performs a maximum likelihood estimation on the output of said partial response filter circuitry to recover said sequence of encoded data, assembles said sequence of encoded data into six-bit codewords, and decodes said six-bit codewords into five-bit source words in accordance with a 5/6 rate maximum transition run code having a minimum $d^2$ free=10.

2. A system for storing data comprising:

a source of data to be stored onto a storage media and a sink for data read from said storage media;

a drive controller coupled to said source and said sink;

a rate 5/6 MTR encoder, coupled to said drive controller, that encodes data received from said drive controller to produce codewords;

a write interface, coupled to said rate 5/6 MTR encoder and to said storage media, that stores said codewords onto said storage media;

a read interface, coupled to said storage media, that reads data stored on said storage media and generates codewords therefrom; and a rate 5/6 MTR decoder, coupled to said read interface, for decoding codewords received from said read interface and recovering data stored to said storage media;

wherein said rate 5/6 MTR encoder produces codewords having a minimum $d^2$ free=10.

3. A method for encoding and decoding data using a rate 5/6 maximum transition run code comprising the steps of:

providing a series of source words of five-bit width;

mapping each of said source words, in turn, into a current write codeword of six-bit width employing one of two encoding tables, where the encoding table that is used is selected based upon whether a previous write codeword ended with a binary '1' or '0', where contents of said encoding tables are designed to ensure that said current write codeword contains no more than 2 adjacent binary '1' symbols;

generating a sequence of encoded bits made up from a sequence of codewords arranged such that bits of said current write codeword are placed in the encoded sequence between bits of said previous write codeword and bits of a subsequent write codeword;

applying a runlength limiting transformation to said sequence of encoded bits when said sequence of encoded bits contains a series of six or more '0' symbols, where said runlength limiting transformation has a corresponding reverse transformation operation that restores said sequence of encoded bits, and where said runlength limiting transformation ensures that said sequence of encoded bits contains no more than two adjacent binary '1' symbols and no more than six adjacent binary '0' symbols; and decoding a sequence of read codewords by applying said reverse transformation operation and using a table to convert said read codewords into unencoded words of five-bit width.

* * * * *